United States Patent
Ishida (10) Patent No.: US 8,921,711 B2
(45) Date of Patent: Dec. 30, 2014

(54) WIRING SUBSTRATE AND ELECTRONIC DEVICE

(75) Inventor: Hisashi Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 151 days.

(21) Appl. No.: 13/813,629

(22) PCT Filed: Jul. 7, 2011

(86) PCT No.: PCT/JP2011/003894
§ 371 (c)(1),
(2), (4) Date: Jan. 31, 2013

(87) PCT Pub. No.: WO2012/042711
PCT Pub. Date: Apr. 5, 2012

(65) Prior Publication Data
US 2013/0126227 A1    May 23, 2013

(30) Foreign Application Priority Data
Sep. 30, 2010  (JP) .................................. 2010-220529

(51) Int. Cl.
*H05K 9/00* (2006.01)
*H05K 1/02* (2006.01)

(52) U.S. Cl.
CPC .............. *H05K 9/00* (2013.01); *H05K 1/0236* (2013.01); *H05K 2201/0715* (2013.01)
USPC ........................... 174/382; 174/386; 361/818

(58) Field of Classification Search
CPC .................................................. H05K 9/0018
USPC .................................. 174/386, 382; 361/818
See application file for complete search history.

(56) References Cited

U.S. PATENT DOCUMENTS

| 6,370,033 | B1* | 4/2002 | Saegusa et al. ............... 361/777 |
| 8,013,258 | B2* | 9/2011 | Wu ................................ 174/382 |
| 8,432,706 | B2* | 4/2013 | Kim et al. ...................... 361/792 |
| 2005/0029632 | A1 | 2/2005 | McKinzie, III et al. |
| 2007/0120223 | A1 | 5/2007 | McKinzie, III et al. |

(Continued)

FOREIGN PATENT DOCUMENTS

| JP | 7-263871 A | 10/1995 |
| JP | 2001-68801 A | 3/2001 |

(Continued)

OTHER PUBLICATIONS

International Search Report (ISR) (PCT Form PCT/ISA/210) dated Aug. 30, 2011, in PCT/JP2011/003894.

(Continued)

*Primary Examiner* — Hung V Ngo
(74) *Attorney, Agent, or Firm* — McGinn IP Law Group, PLLC (57) ABSTRACT

Leakage of electromagnetic noise from a wiring substrate is suppressed. A wiring substrate (1) includes a multilayered wiring layer, a structure (8) of a conductor, and an electromagnetic wave absorber (5). An electronic component (2) which is an example of an electromagnetic noise generation source is mounted on the wiring substrate (1). The electronic component (2) has a high-frequency circuit. The structure (8) is formed using the multilayered wiring layer, and is arranged so as to enclose the electronic component (2) in plan view with an opening (4) in the enclosure. The electromagnetic wave absorber (5) is arranged so as to cover the opening (4).

10 Claims, 9 Drawing Sheets

(56) References Cited

U.S. PATENT DOCUMENTS

| | | | |
|---|---|---|---|
| 2009/0080172 A1* | 3/2009 | Arslan et al. | 361/816 |
| 2010/0212951 A1* | 8/2010 | Kim et al. | 174/386 |
| 2010/0265159 A1 | 10/2010 | Ando et al. | |
| 2011/0067914 A1* | 3/2011 | Jung et al. | 174/350 |
| 2011/0067916 A1* | 3/2011 | Kim et al. | 174/350 |
| 2011/0067917 A1* | 3/2011 | Park et al. | 174/350 |
| 2013/0048365 A1* | 2/2013 | Kim et al. | 174/350 |

FOREIGN PATENT DOCUMENTS

| | | |
|---|---|---|
| JP | 2005-302799 A | 10/2005 |
| WO | WO 2005/002295 A2 | 1/2005 |
| WO | WO 2009/082003 A1 | 7/2009 |

OTHER PUBLICATIONS

Shahrooz Shahparnia et al., "Electromagnetic Interference (EMI) Reduction From Printed Circuit Boards (PCB) Using Electromagnetic Bandgap Structures", IEEE Transactions on Electromagnetic Compatibility, vol. 46, No. 4, Nov. 2004, pp. 580-587.

Shawn D. Rogers, "Electromagnetic-Bandgap Layers for Broad-Band Suppression of TEM Modes in Power Planes", IEEE Transactions on Microwave Theory and Techniques, vol. 53, No. 8, Aug. 2005, pp. 2495-2505.

* cited by examiner

FIG. 1

(b) SECTIONAL VIEW TAKEN ALONG LINE A-A'

(b) SECTIONAL VIEW TAKEN ALONG LINE A-A'

FIG. 6

(b) SECTIONAL VIEW TAKEN ALONG LINE A-A'

(b) SECTIONAL VIEW TAKEN ALONG LINE A-A'

(c) SECTIONAL VIEW TAKEN ALONG LINE B-B'

(d) SECTIONAL VIEW TAKEN ALONG LINE A-A'

(e) SECTIONAL VIEW TAKEN ALONG LINE A-A'

WIRING SUBSTRATE AND ELECTRONIC DEVICE

TECHNICAL FIELD

The present invention relates to a wiring substrate and an electronic device capable of suppressing leakage of noise.

BACKGROUND ART

Many electronic apparatuses represented by a computer or the like have an electronic component and a wiring substrate on which the electronic component is mounted. With a higher frequency of recent electronic apparatuses, there is a case where electromagnetic noise which is generated from a high-frequency circuit electromagnetically interferes with other electronic circuits in an electronic apparatus, and affects the operation of the electronic apparatus. As means for suppressing the electromagnetic interference, a structure in which a ground via is arranged in the outer circumference of a wiring substrate, thereby preventing leakage of electromagnetic noise from the end portion of the wiring substrate is suggested. In Patent Document 1 (Japanese Laid-Open Patent Application No. 7-263871), through holes are arranged densely in the periphery of a substrate, and conductor layers on the front and rear surfaces are connected together through the through holes. This technique is also described in Patent Documents 2 and 3.

As means for suppressing electromagnetic interference of a wiring substrate, Non-Patent Documents 1 and 2 suggest a structure in which an electromagnetic band gap (EBG) structure is applied. An EBG material refers to a structure in which a dielectric, metal, or the like is arranged periodically in a two-dimensional or three-dimensional manner to form a band gap for suppressing propagation of an electromagnetic wave in a specific frequency band inside the structure or on a plane.

RELATED DOCUMENT

Patent Document

[Patent Document 1] Japanese Laid-Open Patent Application No. 7-263871
[Patent Document 2] Japanese Laid-Open Patent Application No. 2001-068801
[Patent Document 3] Japanese Laid-Open Patent Application No. 2005-302799

Non-Patent Document

[Non-Patent Document 1] Shahrooz Shahparnia et al, IEEE TRANSACTIONS ON ELECTROMAGNETIC COMPATIBILITY, VOL. 46, NO. 4, NOVEMBER 2004
[Non-Patent Document 2] Shawn D. Rogers, IEEE TRANSACTIONS ON MICROWAVE THEORY AND TECHNIQUES, VOL. 53, NO. 8, AUGUST 2005

DISCLOSURE OF THE INVENTION

However, as means for suppressing electromagnetic interference, a structure in which a ground via or an EBG structure is arranged in the outer circumference of the wiring substrate is a structure in which electromagnetic noise is confined in the wiring substrate. Energy of electromagnetic noise confined in the wiring substrate causes electromagnetic leakage from a different location on the wiring substrate, and as a result, it may not be possible to suppress leakage of electromagnetic noise.

An object of the invention is to provide a wiring substrate and an electronic device capable of suppressing leakage of electromagnetic noise.

The invention provides a wiring substrate including a multilayered wiring layer, a structure which is formed using the multilayered wiring layer, and in which a conductor is repeatedly arranged so as to enclose an electromagnetic noise generation source in plan view with an opening in the enclosure, and an electromagnetic wave absorber which is arranged in the opening.

The invention provides an electronic device including an electronic component having a high-frequency circuit, and a wiring substrate on which the electronic component is mounted, wherein the wiring substrate includes a multilayered wiring layer, a structure which is formed using the multilayered wiring layer, and in which a conductor is repeatedly arranged so as to enclose the electronic component in plan view with an opening in the enclosure, and an electromagnetic wave absorber which is arranged so as to cover the opening.

According to the invention, it is possible to suppress leakage of electromagnetic noise from a wiring substrate.

BRIEF DESCRIPTION OF THE DRAWINGS

The above and other objects, features, and advantages will be apparent from the following embodiment and the accompanying drawings.

DESCRIPTION OF EMBODIMENTS

Hereinafter, embodiments of the invention will be described with reference to the drawings. In all of the drawings, the same constituent elements are represented by the same reference numerals, and description will not be repeated appropriately.

First Embodiment

FIG. 1(a) is a plan view showing the configuration of a wiring substrate 1 according to a first embodiment, and FIG. 1(b) is a sectional view taken along the line A-A' of FIG. 1(a). The wiring substrate 1 includes a multilayered wiring layer, a structure 8 of a conductor, and an electromagnetic wave absorber 5. An electronic component 2 which is an example of an electromagnetic noise generation source is mounted on the wiring substrate 1. The electronic component 2 has a high-frequency circuit. The structure 8 is formed using the multilayered wiring layer, and is arranged so as to enclose the electronic component 2 in plan view with an opening 4 in the enclosure. The electromagnetic wave absorber 5 is arranged so as to cover the opening 4. Hereinafter, detailed description will be provided.

Figure 1:
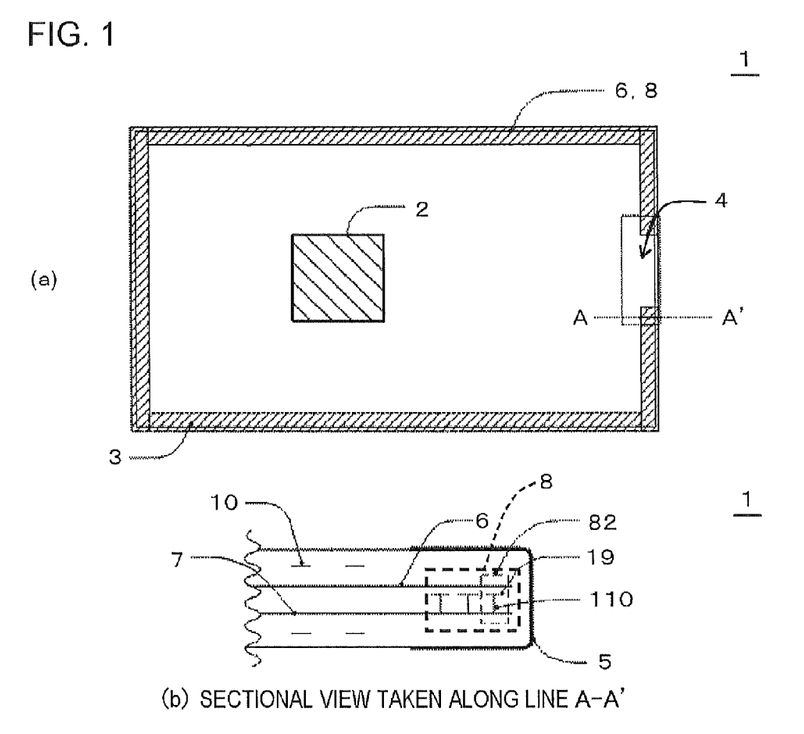
FIG. 1 is a diagram showing the configuration of a wiring substrate 1 according to a first embodiment.

The wiring substrate 1 is, for example, a printed wiring substrate, and has a multilayered wiring structure as described above. For example, the wiring substrate 1 has a power layer 6, a ground layer 7 below the power layer 6, and a signal layer 10. The power layer 6 is connected to the electronic component 2 through a via (not shown), and supplies power to the electronic component 2. The ground layer 7 is connected to the electronic component 2 through a via (not shown). The signal layer 10 is connected to the electronic component 2 through a via (not shown), inputs a signal to the electronic component 2, and transmits a signal output from the electronic component 2 to another electronic component 2. The power layer 6 and the ground layer 7 are constituted by at least one solid layer (conductor plane).

The wiring substrate 1 has an EBG forming region 3 in a portion excluding a region where the opening 4 is formed in the outer circumference of an inner layer. A structure 8 having a characteristic as an EBG is provided in the EBG forming region 3. The structure 8 has a stop band in a predetermined frequency band. The frequency band which becomes the stop band includes electromagnetic noise from the electronic component 2 as a noise source. Although the opening 4 is provided in the central portion of the short side of the rectangular wiring substrate 1, the position of the opening 4 is not limited thereto.

In this embodiment, the structure 8 is an aggregate in which unit cells 82 of the EBG structure are arranged in three rows. Each unit cell 82 has the power layer 6 provided in the wiring substrate 1, a conductor patch 19 which is an island-shaped conductor, a via (through hole) 110, and the ground layer 7. Although the unit cell 82 has, for example, a mushroom structure, any structure may be made unless the characteristic as the EBG is exhibited.

The structure 8 has a plurality of unit cells 82 repeatedly provided. When the unit cells 82 are arranged "repeatedly", in adjacent unit cells 82, an interval (inter-center distance) between the same connection members is preferably within ½ of the wavelength λ of electromagnetic noise. The term "repeatedly" includes a case where a part of any unit cell 82 is missing. When the unit cells 82 have a two-dimensional array, the term "repeatedly" includes a case where the unit cell 82 is partially missing. The term "periodicity" includes a case where part of constituent elements in some unit cells 82 is misaligned or a case where some unit cells 82 are misaligned. That is, even if periodicity breaks down in a strict sense, when the unit cells 82 are arranged repeatedly, since a characteristic as a metamaterial can be obtained, a certain degree of being missing is permitted in regard to "periodicity". The factor causing the state of being missing is when a wiring, a via, or a connection member passes between the unit cells 82, when a metamaterial structure is added to an existing wiring layout or inter-substrate connection structure, and the unit cell 82 cannot be arranged due to an existing via, pattern, or connection member, manufacturing errors, when an existing via, pattern, or connection member is used as a part of the unit cell 82, or the like.

As described above, the opening 4 is provided in a portion of the structure 8 formed at the edge of the wiring substrate 1. The width of the opening 4 is arbitrarily determined taking into consideration the frequency of the electromagnetic noise. The electromagnetic wave absorber 5 is provided in the opening 4. The electromagnetic wave absorber 5 is pasted from the front surface of the wiring substrate 1 to the rear surface through the lateral surface so as to cover the opening 4, and the width of the electromagnetic wave absorber 5 is greater than the opening 4. As the electromagnetic wave absorber 5, one having a large electromagnetic noise suppression effect is arbitrarily selected taking into consideration the frequency of the electromagnetic noise and the mode of a leaked electromagnetic wave.

Figure 2:
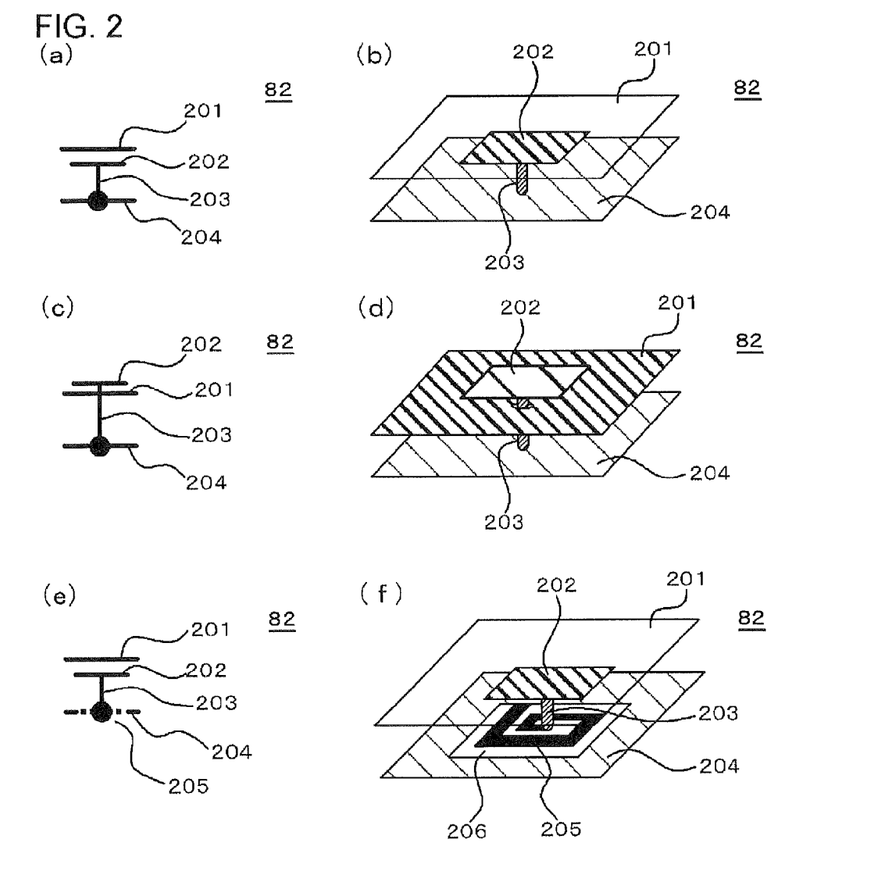
FIG. 2 is a diagram showing a specific example of a unit cell of an EBG structure.
Figure 3:
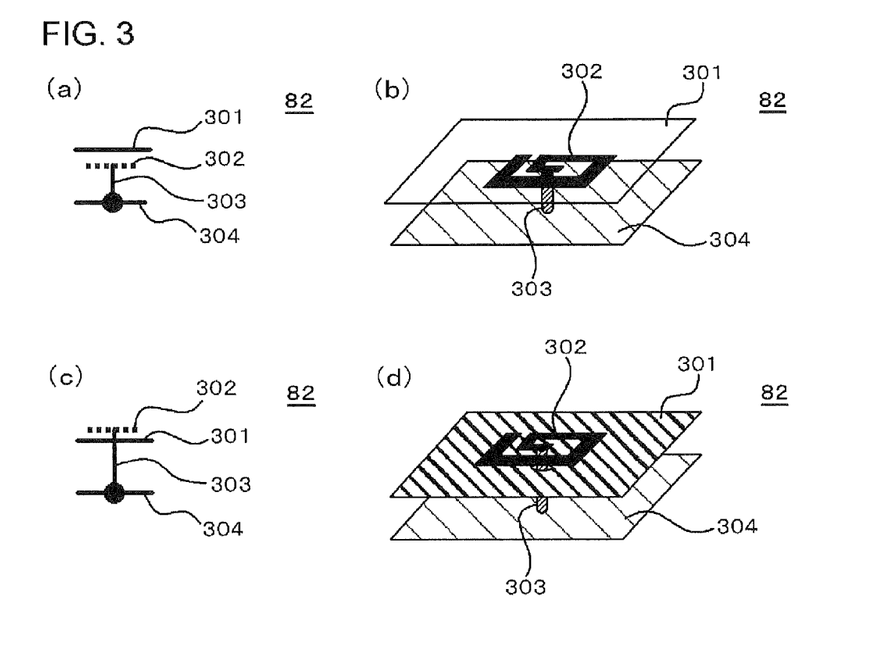
FIG. 3 is a diagram showing a specific example of a unit cell of an EBG structure.
Figure 4:
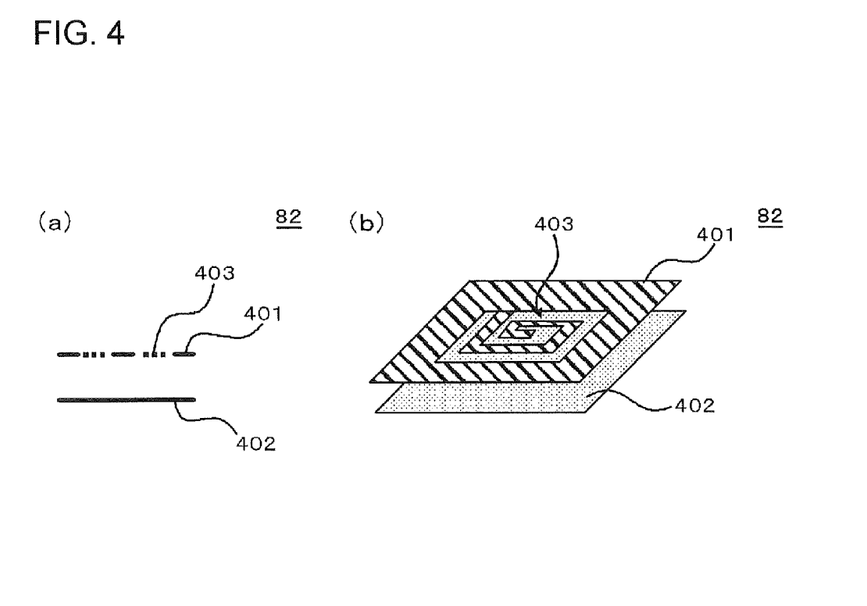
FIG. 4 is a diagram showing a specific example of a unit cell of an EBG structure.

FIGS. 2, 3, and 4 show a specific example of the unit cell 82 of the structure 8. The unit cell of the EBG structure is not limited to the examples shown in FIGS. 2 to 4.

In the examples shown in FIG. 2, the unit cells 82 of a so-called mushroom-type EBG structure or a similar EBG structure are shown. Each unit cell 82 has a first conductor plain 201, a second conductor plain 204, and a conductor element 202. The conductor element 202 is an island-shaped conductor and connected to the second conductor plain 204 by a connection member 203, such as a via. The connection member 203 corresponds to a shaft portion of the mushroom and forms inductance. The conductor element 202 corresponds to a head of the mushroom and forms capacitance with the first conductor plain 201. The mushroom-type EBG structure can be expressed by an equivalent circuit in which the parallel flat plates of the first conductor plain 201 and the second conductor plain 204 are shunted by a serial resonance circuit having the capacitance and the inductance. The resonance frequency of the serial resonance circuit gives the center frequency of the band gap in which attenuation is greatest.

FIG. 2(*a*) is a schematic sectional view showing the layer configuration of a unit cell of an EBG structure shown in FIG. 1, and FIG. 2(*b*) is a perspective view. The power layer 6 and the ground layer 7 of FIG. 1 respectively correspond to the first conductor plain 201 and the second conductor plain 204 of FIG. 2. The conductor patch 19 and the via 110 of FIG. 1 correspond to the conductor element 202 and the connection member 203 of FIG. 2. In the examples of FIGS. 2(*a*) and 2(*b*), the second conductor plain 204, the conductor element 202, and the first conductor plain 201 are arranged in the thickness direction in this order.

FIG. 2(*c*) is a schematic sectional view of an EBG structure in which the first conductor plain 201 is arranged between the conductor element 202 and the second conductor plain 204, and FIG. 2(*d*) is a perspective view. In the examples of FIGS. 2(*c*) and 2(*d*), the second conductor plain 204, the first conductor plain 201, and the conductor element 202 are arranged in the thickness direction in this order. The connection member 203 passes the opening provided in the first conductor plain 201 and is connected to the conductor element 202 while securing insulation from the first conductor plain 201.

In the examples of FIGS. 2(*e*) and 2(*f*), in addition to the example shown in FIG. 2(*b*), the second conductor plain 204 has an opening portion 206. A planar coil 205 is formed in the opening portion 206. The planar coil 205 connects the second conductor plain 204 and the connection member 203. That is, the second conductor plain 204 is connected to the conductor element 202 through the planar coil 205 and the connection member 203. The planar coil 205 can cause an increase in inductance, having an advantage in reduction in the size of a unit cell of an EBG structure or low frequency of a band gap.

FIG. 3 is similar to the examples shown in FIGS. 2(*a*) and 2(*c*), and shows a structure in which a spiral conductor element 302 is provided instead of the island-shaped conductor element 202, that is, a so-called open stub-type ERG structure or a similar structure. The conductor element 302 is a microstrip line which is electrically coupled to an opposite first conductor plain 301, has one end which becomes an open end, and functions as an open stub. FIGS. 3(a) and 3(b) are respectively a schematic sectional view and a perspective view of a structure in which the conductor element 302 is arranged between the first conductor plain 301 and a second conductor plain 304. FIGS. 3(c) and 3(d) are respectively a schematic sectional view and a perspective view of a structure in which the first conductor plain 301 is arranged between the conductor element 302 and the second conductor plain 304. Of course, the first conductor plain 301 and the second conductor plain 304 correspond to the power layer 6 and the ground layer 7 shown in FIG. 1.

In FIG. 4, a spiral conductor element 403 formed in the first conductor plain 401 is opposite a second conductor plain 402. This structure is excellent in that the number of layers necessary for constituting the ERG structure can be reduced. Of course, the first conductor plain 401 and the second conductor plain 402 correspond to the power layer 6 and the ground layer 7 shown in FIG. 1.

Next, the actions and effects of this embodiment will be described. Although there is a risk that part of electromagnetic noise from the electronic component 2 as a generation source may leak from the periphery of the wiring substrate 1 which becomes a conductor plain end portion, noise is reflected by the structure 8 (EBG) excluding the region where the opening 4 is provided. While electromagnetic noise concentrates on the opening 4 which is a unique leakable region in the periphery of the wiring substrate 1, since the electromagnetic wave absorber 5 is provided in the opening 4, electromagnetic noise is absorbed by the electromagnetic wave absorber 5. Therefore, it is possible to suppress the accumulation of energy of electromagnetic noise in the region enclosed by the structure 8, thereby suppressing leakage of electromagnetic noise from the portion other than the edge of the wiring substrate 1.

Second Embodiment

FIG. 5(a) is a plan view showing the configuration of a wiring substrate according to a second embodiment, and FIG. 5(b) is a sectional view taken along the line A-A' of FIG. 5(a). A wiring substrate 1 of this embodiment has the same configuration as the wiring substrate 1 of the first embodiment excluding the following points.

Figure 5:
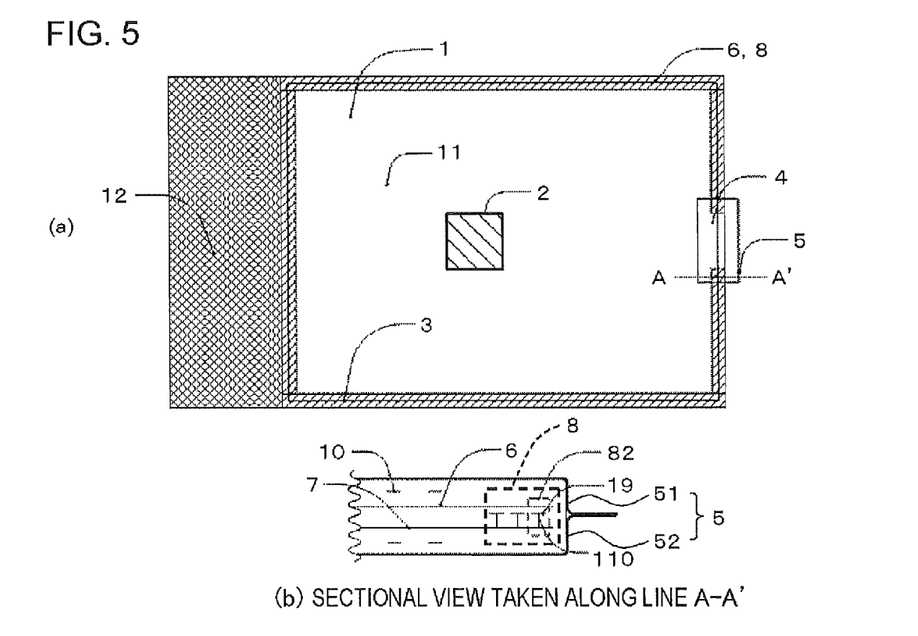
FIG. 5 is a diagram showing the configuration of a wiring substrate according to a second embodiment.

First, the wiring substrate 1 has a first region 11 where a digital circuit is provided, and a second region 12 where an analog circuit is provided. The electronic component 2 which becomes an electromagnetic noise generation source is provided in the first region 11. The structure 8 and the electromagnetic wave absorber 5 are laid out so as to enclose the first region 11 and not to enclose the second region 12.

The electromagnetic wave absorber 5 has an upper absorber 51 and a lower absorber 52. The upper absorber 51 is pasted from the front surface of the wiring substrate 1 to the center of the lateral surface, and the lower absorber 52 is pasted from the rear surface of the wiring substrate 1 to the center of the lateral surface. The end portion of the upper absorber 51 and the lower absorber 52 are pasted to each other near the lateral surface of the wiring substrate 1.

In this embodiment, the same effects as in the first embodiment can be obtained. Since the structure 8 and the electromagnetic wave absorber 5 enclose the first region 11 and do not enclose the second region 12, the first region 11 and the second region 12 can be separated by the structure 8. Therefore, it is possible to prevent noise generated from a logic circuit provided in the first region 11 from adversely affecting an analog circuit provided in the second region 12.

Third Embodiment

FIG. 6(a) is a plan view showing the configuration of a wiring substrate 1 according to a third embodiment, and FIG. 6(b) is a sectional view taken along the line A-A' of FIG. 6(a). The wiring substrate 1 of this embodiment has the same configuration as the wiring substrate 1 according to the second embodiment excluding that the opening portion 4 and the electromagnetic wave absorber 5 are provided at multiple locations, and a through via (through hole) 111 is provided instead of the via (through hole) 110.

Figure 6:
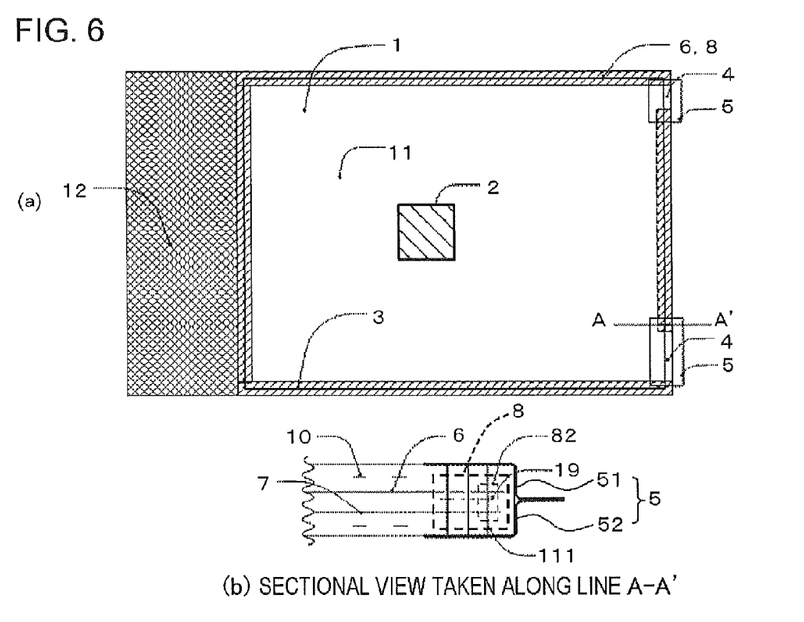
FIG. 6 is a diagram showing the configuration of a wiring substrate according to a third embodiment.

In the embodiment, the opening portion 4 and the electromagnetic wave absorber 5 are provided at both ends of one short side of the wiring substrate 1. The through via 111 is formed to pass from the upper surface to the rear surface of the wiring substrate 1.

In this embodiment, the same effects as in the second embodiment can be obtained. Since the opening portion 4 and the electromagnetic wave absorber 5 are provided at multiple locations, electromagnetic noise can be more efficiently absorbed.

Fourth Embodiment

FIG. 7(a) is a plan view showing the configuration of a wiring substrate 1 according to a fourth embodiment. FIGS. 7(b) and 7(c) are a sectional view taken along the line A-A' of FIG. 7(a) and a sectional view taken along the line B-B' of FIG. 7(a). FIGS. 7(d) and 7(e) are diagrams showing a modification of the section taken along the line A-A' of FIG. 7(a). The wiring substrate 1 of this embodiment has the same configuration as the wiring substrate 1 according to the second embodiment excluding the following points.

Figure 7:
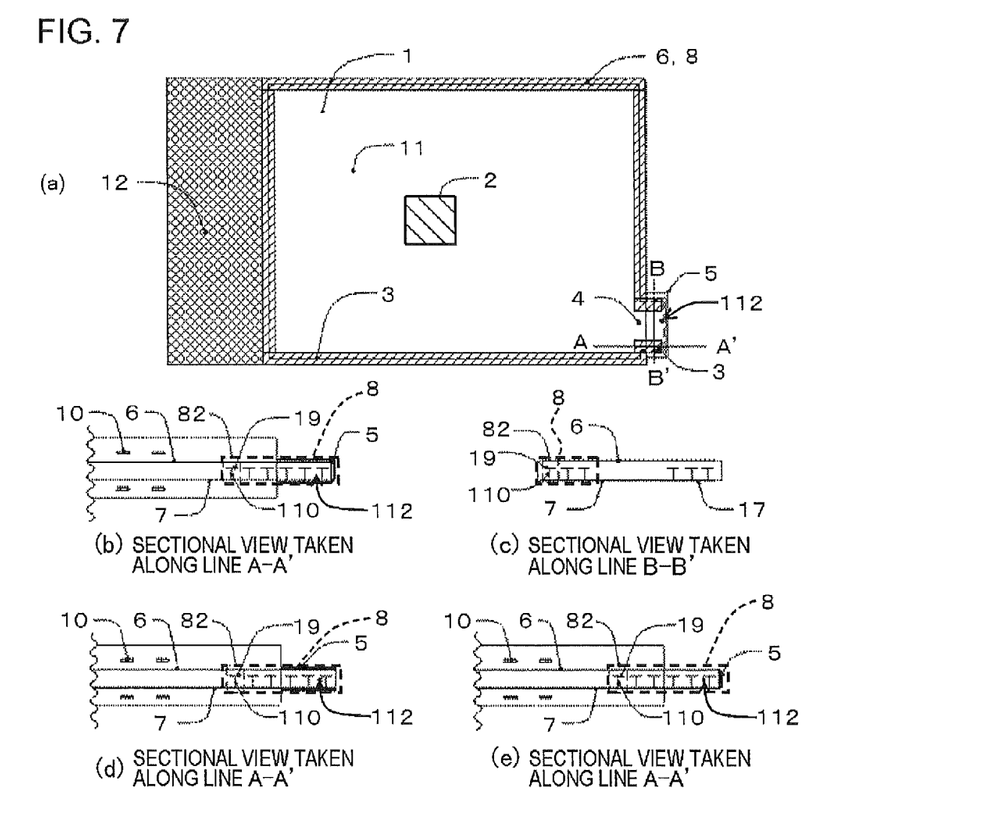
FIG. 7 is a diagram showing the configuration of a wiring substrate according to a fourth embodiment.

First, an opening 4 is provided in an end portion of a short side of the wiring substrate 1, and has a protruding portion 112. The protruding portion 112 has a shape in which a part of the short side protrudes along the extension direction of the long side of the wiring substrate 1. The wiring layer provided in the structure 8 protrudes from the main body of the wiring substrate 1 to form the protruding portion 112. In the example shown in the drawing, the power layer 6, the ground layer 7, and a layer between the power layer 6 and the ground layer 7 protrude to form the protruding portion 112. The structure 8 is formed in the protruding portion 112. Specifically, the structure 8 is provided so as to enclose the first region 11 excluding a region where the protruding portion 112 is formed and to extend along the edge of the protruding portion 112. The structure 8 is not provided in the edge portion of the protruding portion 112.

The electromagnetic wave absorber 5 is arranged in the protruding portion 112. For this reason, the electromagnetic wave absorber 5 is connected directly to the wiring layer constituting the structure 8. Although in the example shown in FIG. 7(a), the electromagnetic wave absorber 5 covers the entire upper surface, the entire end surface, and the entire lower surface of the protruding portion 112, as shown in FIG. 7(d), the electromagnetic wave absorber 5 may be provided only on the upper surface and the lower surface of the protruding portion 112, or as shown in FIG. 7(e), the electromagnetic wave absorber 5 may be provided only on the end surface of the protruding portion 112.

In this embodiment, the same effects as in the second embodiment can be obtained. Since the electromagnetic wave absorber 5 can be connected directly to the wiring layer constituting the structure 8, electromagnetic noise can be more efficiently absorbed.

Fifth Embodiment

FIG. 8(a) is a plan view showing the configuration of a wiring substrate 1 according to a fifth embodiment. FIGS. 8(b) and 8(c) are a sectional view taken along the line A-A' of FIG. 8(a) and a sectional view taken along the line B-B' of FIG. 8(a). FIGS. 8(d) and 8(e) are diagrams showing a modification of the section taken along the line A-A' of FIG. 8(a). The wiring substrate 1 of this embodiment has the same configuration as the wiring substrate 1 according to the fourth embodiment excluding that a second wiring substrate 17 is provided instead of the protruding portion 112.

Figure 8:
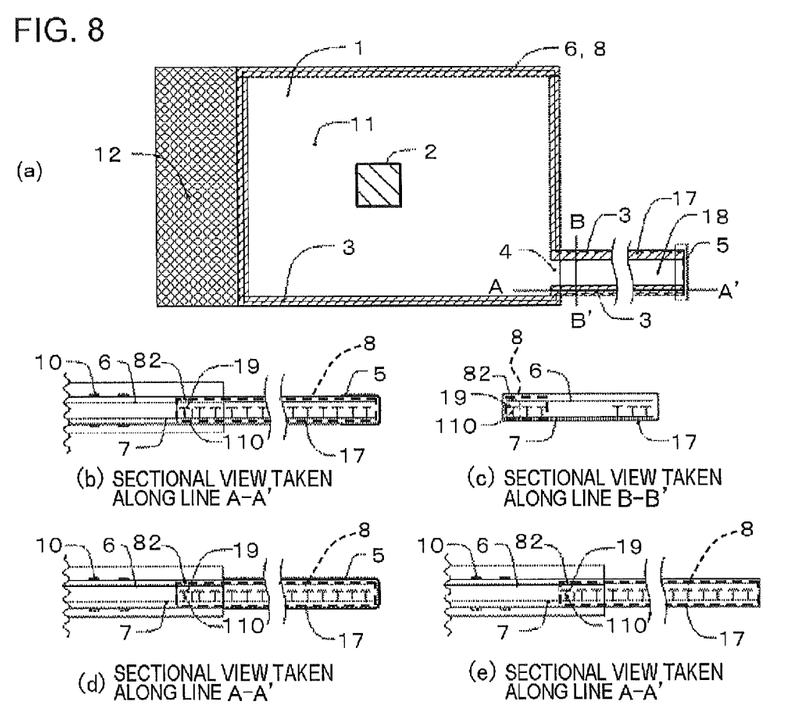
FIG. 8 is a diagram showing the configuration of a wiring substrate according to a fifth embodiment.

The second wiring substrate 17 is, for example, a multilayered flexible substrate. A structure 8 is provided in the second wiring substrate 17 like the protruding portion 112 of the fourth embodiment.

An electromagnetic wave absorber 5 is arranged in the second wiring substrate 17. Although in the example shown in FIG. 8(a), the electromagnetic wave absorber 5 covers a portion near the end surface of the upper surface, the entire end surface, and a portion near the end surface of the lower surface of the second wiring substrate 17, as shown in FIG. 8(d), the electromagnetic wave absorber 5 may cover the entire upper surface and the entire end surface, and the entire lower surface of the second wiring substrate 17. As shown in FIG. 8(e), when the second wiring substrate 17 is sufficiently long (for example, when the terminal portion of the flexible substrate is completely drawn out to a position when there is no effect of electromagnetic noise), the electromagnetic wave absorber 5 may not be provided.

In this embodiment, the same effects as in the second embodiment can be obtained.

Sixth Embodiment

FIG. 9(a) is a plan view showing the configuration of a wiring substrate 1 according to a sixth embodiment. FIGS. 8(b) and 8(c) are a sectional view taken along the line A-A' of FIG. 8(a) and a sectional view taken along the line B-B' of FIG. 8(a). FIG. 8(d) is a diagram showing a modification of the section taken along the line A-A' of FIG. 8(a). The wiring substrate 1 of this embodiment has the same configuration as the wiring substrate according to the fifth embodiment excluding that the second wiring substrate 17 has a wiring layer exposing portion 113 in a tip portion.

The wiring layer exposing portion 113 is a region where a wiring layer constituting an EBG is exposed from the front surface and the rear surface. An electromagnetic wave absorber 5 is provided in the wiring layer exposing portion 113. As shown in FIG. 8(d), the wiring layer exposing portion 113 and the electromagnetic wave absorber 5 may be formed over the entire second wiring substrate 17.

Figure 9:
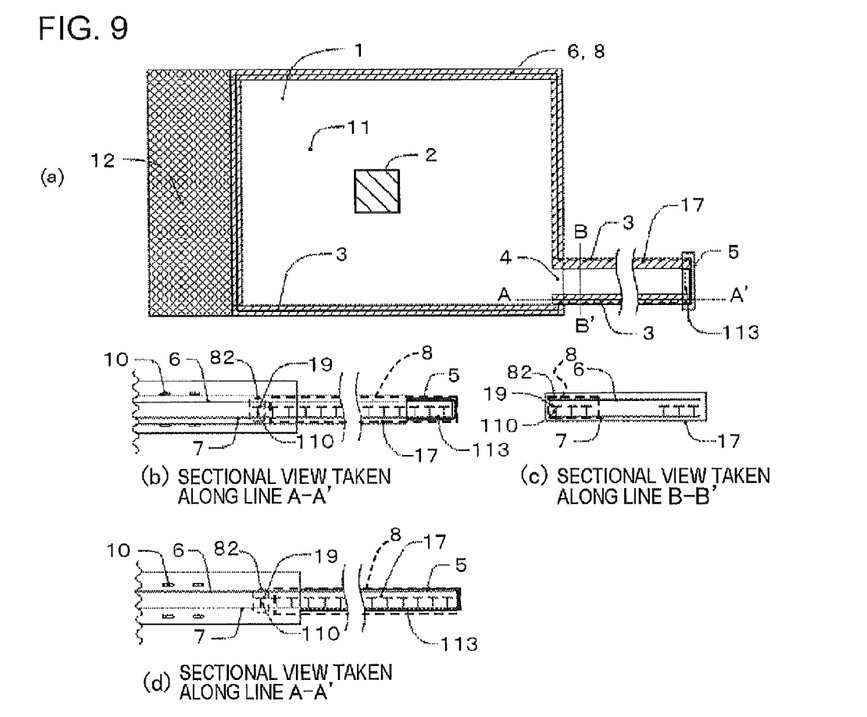
FIG. 9 is a diagram showing the configuration of a wiring substrate according to a sixth embodiment.

In this embodiment, the same effects as in the fifth embodiment can be obtained. Since the electromagnetic wave absorber 5 can be connected directly to the wiring layer constituting the structure 8, electromagnetic noise can be more efficiently absorbed.

Although the embodiments of the invention have been described with reference to the drawings, the embodiments are for illustration of the invention, and various other configurations may be used.

FIG. 8(e) discloses the following invention.

A wiring substrate includes a first wiring substrate, and a second wiring substrate, wherein the first wiring substrate has a multilayered wiring layer, and a first structure which is formed using the multilayered wiring layer, and in which a conductor is repeatedly arranged so as to enclose an electromagnetic noise generation source in plan view with an opening in the enclosure, the second wiring substrate has a second structure which is connected to the first wiring substrate through the opening, and in which a conductor is repeatedly arranged so as to be continuous to the first structure, and the second structure is not provided in an open-side end portion of the second wiring substrate.

This application claims priority based on Japanese Patent Application No. 2010-220529, filed Sep. 30, 2010, the disclosure of which is incorporated herein.

The invention claimed is:

1. A wiring substrate comprising:
a multilayered wiring layer;
a structure which is formed using the multilayered wiring layer, and in which a conductor is repeatedly arranged so as to enclose an electromagnetic noise generation source in plan view with an opening in the enclosure; and
an electromagnetic wave absorber which is arranged in the opening.

2. The wiring substrate according to claim 1, wherein the structure has a characteristic as an electromagnetic band gap (EBG).

3. The wiring substrate according to claim 2, wherein the stop band of the structure includes the frequency of the electromagnetic noise.

4. The wiring substrate according to claim 1, wherein the structure and the electromagnetic wave absorber are provided at the edge of the wiring substrate.

5. The wiring substrate according to claim 1, wherein the wiring substrate has a first region where the generation source is arranged and a second region where an analog circuit is mounted, and
the structure and the electromagnetic wave absorber enclose the first region in plan view, and do not enclose the second region.

6. The wiring substrate according to claim 1, wherein a wiring layer constituting the structure protrudes from the opening in plan view to form a protruding portion,
the structure is formed in the protruding portion excluding an end portion, and
the electromagnetic wave absorber is provided in the protruding portion.

7. The wiring substrate according to claim 1, further comprising:
a first wiring substrate substantially having a rectangular shape in which the opening is provided in plan view; and
a second wiring substrate substantially having a rectangular shape which is connected to the opening of the first wiring substrate in plan view,
wherein the first wiring substrate has the generation source, and
the structure is formed from the first wiring substrate to the second wiring substrate.

8. The wiring substrate according to claim 7, wherein the first wiring substrate comprises a printed wiring substrate, and
the second wiring substrate comprises a flexible wiring substrate.

9. The wiring substrate according to claim 7, wherein, in at least a portion of the second wiring substrate, a wiring layer constituting the structure is exposed from an upper surface and a lower surface, and
the electromagnetic wave absorber is connected directly to a wiring layer constituting the structure.

10. An electronic device comprising:
an electronic component having a high-frequency circuit; and
a wiring substrate on which the electronic component is mounted,
wherein the wiring substrate includes
a multilayered wiring layer,
a structure which is formed using the multi layered wiring layer, and in which a conductor is repeatedly arranged so as to enclose the electronic component in plan view with an opening in the enclosure, and an electromagnetic wave absorber which is arranged so as to cover the opening.

* * * * *